United States Patent
Hiller et al.

(10) Patent No.: US 7,012,554 B2
(45) Date of Patent: Mar. 14, 2006

(54) THERMOELECTRIC VEHICLE TRACKING DEVICE

(75) Inventors: Nathan D. Hiller, San Diego, CA (US);
John C. Bass, La Jolla, CA (US);
Daniel T. Allen, La Jolla, CA (US)

(73) Assignee: Hi-Z Technology, Inc., San Diego, CA (US)

( * ) Notice: Subject to any disclaimer, the term of this patent is extended or adjusted under 35 U.S.C. 154(b) by 130 days.

(21) Appl. No.: 10/734,319

(22) Filed: Dec. 12, 2003

(65) Prior Publication Data

US 2004/0128041 A1    Jul. 1, 2004

Related U.S. Application Data

(63) Continuation-in-part of application No. 10/021,097, filed on Dec. 12, 2001, now Pat. No. 6,828,579.

(60) Provisional application No. 60/460,057, filed on Apr. 3, 2003.

(51) Int. Cl.
*G08G 1/123*    (2006.01)

(52) U.S. Cl. .................. 340/988; 342/450; 342/457; 136/200; 136/205; 701/207; 701/213

(58) Field of Classification Search ............... 340/988; 342/450, 457; 130/200, 205; 701/207, 213
See application file for complete search history.

(56) References Cited

U.S. PATENT DOCUMENTS

| 6,207,887 B1 * | 3/2001 | Bass et al. .................. 136/201 |
| 6,624,349 B1 * | 9/2003 | Bass ........................... 136/205 |
| 2002/0148690 A1 * | 10/2002 | Wirth et al. ............ 188/1.11 E |

* cited by examiner

*Primary Examiner*—Daniel Wu
*Assistant Examiner*—Samuel J. Walk
(74) *Attorney, Agent, or Firm*—John R. Ross; John R. Ross, III

(57) ABSTRACT

A tracking device for tracking a vehicle in which a radio transmitter is powered by heat energy of the exhaust system of an engine propelling the vehicle. A thermoelectric module is attached to a hot portion of the exhaust system. Electrical power generated by the thermoelectric module is used to power the transmitter. A preferred tracking device consists of one thermoelectric module, one transmitter, a flexible finned plate for dissipating heat, and two high Curie temperature magnets for attaching the device to the vehicle's tail pipe. The transmitter is mounted on the flexible finned plate with a thermal insulator in-between them.

15 Claims, 1 Drawing Sheet

THERMOELECTRIC VEHICLE TRACKING DEVICE

This application is a continuation in part of Ser. No. 10/021,097 now U.S. Pat. No. 6,828,579 filed Dec. 12, 2001 which is incorporated herein by reference and also claims the benefit of Provisional Application Ser. No. 60/460,057 filed Apr. 3, 2003. The present invention relates to tracking devices and in particular to power sources for tracking devices.

BACKGROUND OF THE INVENTION

A well-known use for thermoelectric devices is for the extraction of electric power from waste heat. For example, U.S. Pat. No. 6,527,548 discloses a self powered space heater for a truck in which heat energy for the heater is used to power electric components of the heater plus charge a battery. In U.S. Pat. No. 6,053,163 heat from a stovepipe is used to generate electricity. U.S. Pat. No. 6,019,098 discloses a self-powered furnace. Various types of thermoelectric modules are available. A very reliable thermoelectric module with a gap-less egg-crate design capable of high-temperature operation is described in U.S. Pat. Nos. 5,875,098 and 5,856,210. U.S. Pat. No. 6,207,887 discloses a miniature milliwatt thermoelectric module useful in space applications in combination with radioactive heat source. Quantum well very thin layer thermoelectric modules are known. Some are described in U.S. Pat. Nos. 6,096,965, 6,096,964, 5,436,467 and 5,550,387. U.S. Pat. No. 6,624,349 describes an electric generator using a thermoelectric module to generate electric power from the heat of fusion produced by the freezing of a phase change material. All of these patents referred to above are assigned to Applicant's employer and they are all incorporated herein by reference.

Workers in the thermoelectric industry have been attempting too improve performance of thermoelectric devices for the past 20–30 years with not much success. Most of the effort has been directed to reducing the lattice thermal conductivity (K) without adversely affecting the electrical conductivity or Seebeck coefficient. Experiments with superlattice quantum well materials have been underway for several years. These materials were discussed in an paper by Gottfried H. Dohler which was published in the November 1983 issue of Scientific American. This article presents an excellent discussion of the theory of enhanced electric conduction in superlattices. These superlattices contain alternating conducting and barrier layers and are believed to create quantum wells and they do in fact improve electrical conductivity. These superlattice quantum well materials are crystals grown by depositing semiconductors in layers each layer with a thickness in the range of a few to up to about 100 angstroms. The dimensions of atoms are in the range of an angstrom; therefore, each layer is only a few atoms thick. (These quantum well materials are also discussed in articles by Hicks, et al and Harman published in Proceedings of 1992 1st National Thermoelectric Cooler Conference Center for Night Vision & Electro Optics, U.S. Army, Fort Belvoir, Va. The articles project theoretically very high ZT values as the layers are made progressively thinner.) The idea being that these materials might provide very great increases in electric conductivity without adversely affecting Seebeck coefficient or the thermal conductivity. Harmon of Lincoln Labs, operated by Massachusetts Institute of Technology has claimed to have produced a superlattice of layers of (Bi,Sb) and Pb(Te,Se). He claims that his preliminary measurements suggest ZTs of 3 to 4.

Most of the efforts to date with superlattices have involved alloys that are known to be good thermoelectric materials for cooling, many of which are difficult to manufacture as superlattices. A large number of very thin layers (in the '467 patent, about 250,000 layers) together produce a thermoelectric leg 10 about 0.254 cm thick. In the embodiment shown in the figures all the legs are connected electrically in series and otherwise are insulated from each other in an egg-crate type thermoelectric element. Negative charges flow from hot to cold through n-legs and positive charges flow from cold to hot through p-legs; therefore, current flows from the hot side to the cold side through P legs and from the cold side to the hot side through N legs. These patents disclose superlattice layers comprised of: (1) SiGe as conducting layer and Si as a barrier layer and (2) alternating layers of two different alloys of boron carbide. In the '387 patent Applicants disclose that they had discovered that strain in the layers can have very beneficial effects on thermoelectric properties of the elements disclosed in the '467 patent.

Vehicle tracking devices are known. These are typically radio transmitters that are attached to a vehicle. In many cases the tracking devices transmit a location signal to an earth satellite that in turn relays the signal to a station on earth. An owner of a fleet of trucks my install such a transmitter on its trucks so that the location of each of its trucks is known at the Owner's offices at all times. In some cases the transmitters are installed covertly so that the driver of the vehicle is not aware of the transmitter. Police or other crime fighters may use such tracking devices as a method for monitoring the movements of suspected criminals. These tracking devices are normally battery powered and transmission from the devices cease when the battery is discharged.

What is needed is a better technique for providing electric power for vehicle tracking devices.

SUMMARY OF THE INVENTION

The present invention provides a tracking device for tracking a vehicle in which a radio transmitter is powered by heat energy of the exhaust system of the engine propelling the vehicle. A thermoelectric module is attached to a hot portion of the exhaust system. Electrical power generated by the thermoelectric module is used to power the transmitter. A preferred tracking device consists of one thermoelectric module, one transmitter, a flexible finned plate for dissipating heat, and two high Curie temperature magnets for attaching the device to the vehicle's tail pipe. The transmitter is mounted on the flexible finned plate with a thermal insulator in-between them.

DETAILED DESCRIPTION OF PREFERRED EMBODIMENTS

First Preferred Embodiment

In a first preferred embodiment of the present invention a small thermoelectric module is attached to an exhaust pipe of a motor vehicle. The electrical power generated by the thermoelectric module is used to power a tracking transmitter. The thermoelectric module in this embodiment only provides power to the transmitter while the vehicle is operating. This is normally sufficient for tracking purposes because a stationary vehicle does not need to be tracked.

Figure 1:
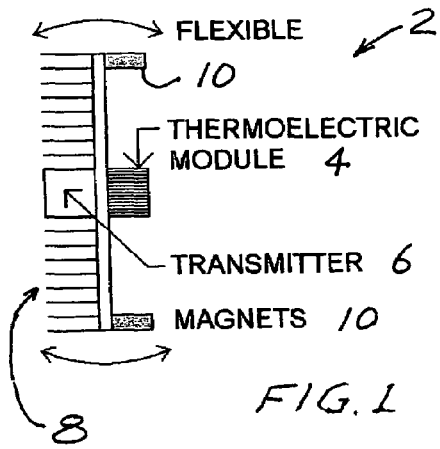
FIG. 1 is a drawing of a preferred embodiment of the present invention.
Figure 2:
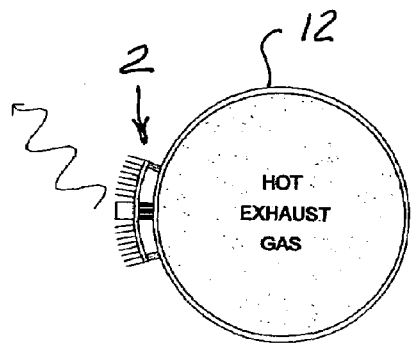
FIG. 2 shows the preferred embodiment installed on a tail pipe.

The tracking device 2 as shown in FIGS. 1 and 2 consists of one thermoelectric module 4, one transmitter 6, a flexible finned plate 8 for dissipating heat, and two high Curie temperature magnets 10 for attaching the device to the vehicle's tail pipe 12. Kapton sheets (not shown) are used to provide electrical insulation between the module and the tail pipe and the flexible finned plate. Kapton is preferred for this purpose since it has the unusual dual properties of high electrical resistivity and low thermal resistivity. The transmitter may be mounted on the flexible finned plate with the thermal insulator in-between them. The thermoelectric module and magnets can be mounted on the opposite side of the flexible finned plate as illustrated in FIG. 1. Mounting the tracking device to a vehicle's exhaust pipe will be easily accomplished because the flexible finned plate will flex to the to the shape of the exhaust pipe allowing the magnets to firmly attach to the pipe as shown in FIG. 2. Note also that this flexible finned plate serves an additional purpose of providing (even with anticipated wide temperature variations) an approximately constant compressive force between the finned plate and the cold side of the module and an approximately constant compressive force between the hot surface of the module and the tail pipe.

Figure 3:
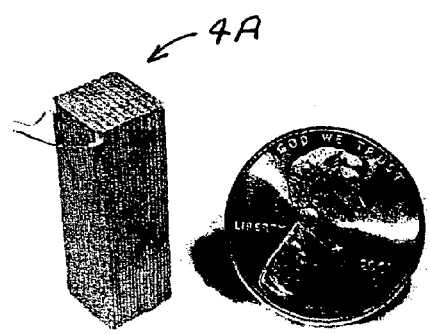
FIG. 3 shows the size of a recommended thermoelectric module compared to a US penny.

In this preferred embodiment the thermoelectric module that will be used to power the transmitter in the tracking device will be a module designed to provide 40 mW. It preferably is a modified version of the prior art module 4A as shown in FIG. 3. The preferred module is 0.15 inch tall and connected parallel/series as necessary to provide the required voltage at expected temperature gradient. The module charges a 3-Volt battery in the transmitter. This type of module is described in detail in U.S. Pat. No. 6,207,887 that was referred to in the background section and has been incorporated herein by reference. This module comprises 324 P-type thermoelectric elements, 324 N-type thermoelectric elements, the P-type elements and said N-type elements being arranged in an array and insulated from each other with self adhering polyimide film. This thermoelectric module is currently used in electric power generators for a variety of government programs relating to: space exploration, Micro Air Vehicles (MAVs), and wireless sensors. The module produces 40 mW of power at 4 V under a temperature difference of 225° C. with a maximum hot side temperature of 250° C. Several life tests performed on the 40 mW module at 250° C. indicate insignificant degradation after 12,000 hours of operation. These types of modules are available from Hi-Z Technology Corporation with offices in San Diego, Calif. Similar modules made by Hi-Z have operated in covert applications for 10 years with stable performance.

Figure 4:
FIG. 4 shows the size of a recommended transmitter compared to a centimeter scale.

The transmitter used in the tracking device will be the Argos certified ST-18 PTT made by Telonics, Inc. as shown at 14 in FIG. 4. The ST-18 PTT operates with a voltage of +4.0 Vdc to 7.2 Vdc and requires ½ watt to transmit via Argos. Argos is a satellite-based system that collects data from autonomous platforms and delivers it to the users worldwide. Since it began in the late-1970's, the Argos system has proven to be simple to use and highly reliable.

Figure 5:
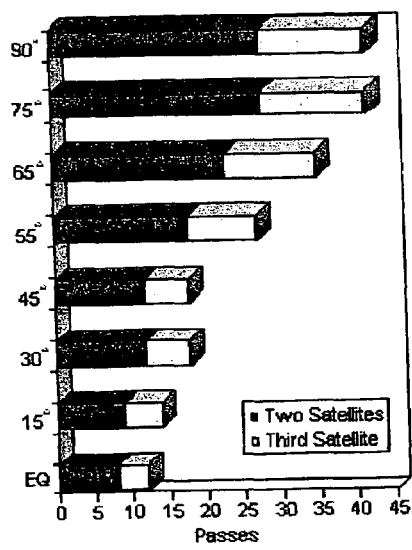
FIG. 5 shows Argos satellite passes per day.

The number of transmissions the tracking device will be able to make per day depends on the number of daily passes the Argos satellites makes over the transmitter. Due to the Argos satellite orbit orientation the number of satellite passes increases with decreasing distance from the poles as indicated in FIG. 5. The duration of the transmitter visibility by the satellite is the "window" during which the satellite can retrieve messages from the transmitter. It lasts between 8 to 15 minutes.

The tracking device will be able to operate throughout the temperature range of −40° C. to +70° C., withstand moderate amounts of shock and vibration, and high humidity. Because the tracking device will require waste heat to power the transmitter, the device will only operate when a vehicle has been operating for at least a few minutes.

The suggested operation of the tracking device is as follows:

1) The tracking device is magnetically attached to a vehicle's exhaust pipe in a discrete manner in approximately 5 seconds. Device will be hidden from anyone walking around the vehicle perimeter.
2) The vehicle is started and begins to move to an unknown location.
3) The device automatically turns on when the exhaust pipe reaches 125° C. The electrical power harnessed from the waste heat is stored in a capacitor.
4) Using the power stored in the capacitors, the transmitter transmits once an hour to Argos satellites.
5) The latitude and longitude of the vehicle is transmitted to an Argos Data Distribution Center*.
6) The Argos Data Distribution Center sends this information to the user's computer via the Internet.
7) Device continues to operate for many years unless discovered by the vehicle operator.

Separating the Thermoelectric Module from the Transmitter

In preferred embodiments the transmitter is installed separate from the module. This permits the installation of the module at a most convenient hot location where cooling air is also available and the installation of the transmitter at a location where there is reduced interference with signal transmission from the antenna. In this case an electrical connection needs to be provided to connect the separate components. Since both components can be easily grounded only a single very thin conductor can carry the electric current from the thermoelectric module to the transmitter.

While the above description contains many specificites, the reader should not construe these as limitations on the scope of the invention, but merely as exemplifications of preferred embodiments thereof. Those skilled in the art will envision many other possible variations within its scope. For example, quantum well type thermoelectric modules such as described in the '965, '964, '467, and '387 patents referred in the background section could be used in place of the module described above. The unit can be attached to parts of the vehicle other than the tail pipe such as the engine manifold. There are many other ways of attaching the tracking unit to a hot spot on the motor vehicle. For example, a spring clip could be used or the unit could be attached using bolts and Belville washers. Preferably, the attachment technique should provide good thermal contact and include a flexible element to take account of thermal expansion of the contacting surfaces as they heat up. Accordingly, the reader is requested to determine the scope of the invention by the appended claims and their legal equivalents, and not by the examples which have been given.

We claim:

1. A waste heat powered vehicle tracking device for attachment to a hot surface of a motor vehicle, said device comprising:
   A) an electric powered radio transmitter,
   B) a thermoelectric module defining a module hot surface and a module cold surface,
   C) a finned element in thermal communication with said thermoelectric to provide cooling of said module cold surface,
   D) an attachment means for holding said thermoelectric module to the hot surface of the motor vehicle with said module hot surface in thermal communication with the hot surface of the motor vehicle,
   E) an electric energy storage device for storing electrical energy generated by said thermoelectric module and for providing electrical power to said transmitter.

2. A tracking device as in claim 1 wherein said attachment means comprises at least one high Curie temperature magnets.

3. A tracking device as in claim 2 wherein said at least one magnet is two magnets and said finned element is a flexible finned element.

4. A tracking device as in claim 1 wherein said attachment means comprises at least one bolt and at least one flexible element.

5. A tracking device as in claim 1 wherein said energy storage device is a capacitor.

6. A tracking device as in claim 1 wherein said energy storage device is a rechargeable battery.

7. A tracking device as in claim 1 wherein said transmitter is programmed to transmit position data to a satellite.

8. A tracking device as in claim 1 wherein said transmitter is an Argos transmitter.

9. A tracking device as in claim 1 wherein said transmitter is mounted on said finned element.

10. A tracking device as in claim 1 wherein said transmitter is mounted on said vehicle at a location separate from said thermoelectric module.

11. A tracking device as in claim 1 wherein said thermoelectric module defines a hot side and a cold side, with said module comprising:
    A) a plurality of P-type thermoelectric elements,
    B) a plurality of N-type thermoelectric elements, said P-type elements and said N-type elements being arranged in an array and insulated from each other with self adhering polyimide film,
    C) a plurality of contacts on said cold side and said hot side connecting said elements in an electric circuit.

12. A tracker as in claim 11 wherein each of said contacts comprise a thin sputtered layer of gold and a gold tab welded over said sputtered layer.

13. A tracker as in claim 11 wherein said module comprises at least 324 N and P legs.

14. A tracking device as in claim 1 wherein said transmitter is mounted on said finned element.

15. A tracking device as in claim 1 wherein said transmitter is mounted on said vehicle at a location separate from said thermoelectric module.

* * * * *